US008253513B2

(12) United States Patent
Zhang

(10) Patent No.: US 8,253,513 B2
(45) Date of Patent: Aug. 28, 2012

(54) TEMPERATURE COMPENSATED THIN FILM ACOUSTIC WAVE RESONATOR

(76) Inventor: Hao Zhang, Zhuhai (CN)

( * ) Notice: Subject to any disclaimer, the term of this patent is extended or adjusted under 35 U.S.C. 154(b) by 295 days.

(21) Appl. No.: 12/724,910

(22) Filed: Mar. 16, 2010

(65) Prior Publication Data

US 2011/0227671 A1 Sep. 22, 2011

(51) Int. Cl.
*H03H 9/02* (2006.01)
*H01L 41/047* (2006.01)

(52) U.S. Cl. ......................... 333/187; 333/191; 310/346

(58) Field of Classification Search .................. 333/187, 333/188, 189, 190, 191, 192; 310/324, 346
See application file for complete search history.

(56) References Cited

U.S. PATENT DOCUMENTS

| | | | | |
|---|---|---|---|---|
| 6,420,820 | B1 * | 7/2002 | Larson, III | 310/346 |
| 7,259,498 | B2 * | 8/2007 | Nakatsuka et al. | 310/324 |
| 7,432,785 | B2 * | 10/2008 | Yoon et al. | 333/189 |
| 7,436,269 | B2 * | 10/2008 | Wang et al. | 333/133 |
| 7,486,006 | B2 * | 2/2009 | Aigner | 310/346 |

* cited by examiner

*Primary Examiner* — Dean O Takaoka
(74) *Attorney, Agent, or Firm* — Morris Manning & Martin LLP; Tim Tingkang Xia, Esq.

(57) ABSTRACT

The present invention in one aspect relates to an acoustic wave resonator having an acoustic reflector, a piezoelectric layer, a composite structure having a first electrode, a temperature compensation layer formed on the first electrode, having one or more vias or trenches formed therein, and a second electrode formed on the temperature compensation layer and electrically connected to the first electrode at least through the one or more vias or trenches, and a third electrode, where the composite structure is disposed under the piezoelectric layer, on the piezoelectric layer, or inside the piezoelectric layer.

24 Claims, 11 Drawing Sheets

300

TEMPERATURE COMPENSATED THIN FILM ACOUSTIC WAVE RESONATOR

FIELD OF THE INVENTION

The present invention relates generally to an acoustic wave resonator, and more particular to a thin film bulk acoustic wave (BAW) resonator that utilizes a composite structure having a temperature compensation layer formed such that no electrical field exists therein so as to improve the temperature stability of the BAW resonator and methods of manufacturing the same.

BACKGROUND OF THE INVENTION

Radio frequency (RF) front-end circuits, such as transceivers, power amplifiers, and passives are increasingly used for wireless communication. The front-end passives include RF filters. RF front-end filters consisting of bulk acoustic wave (BAW) resonators have been proven to have a number of advantages regarding quality factor, power handling, ESD robustness and size over other technologies, such as surface acoustic wave (SAW) devices and ceramic filters. Temperature stable oscillator incorporating BAW resonator has also been demonstrated to be well suited for high-speed serial data applications, such as standard SATA hard disk drives, developing standard USB3 PC peripherals, and fiber optic transceivers.

Typically, a BAW resonator includes an acoustic reflector on which a piezoelectric film is sandwiched between two metal electrodes. FIG. 10 shows a conventional BAW resonator. The BAW resonator has a substrate 11, an acoustic reflector layer 12 formed on the substrate 11, a bottom electrode layer 13 formed on the acoustic reflector layer 12, a piezoelectric layer 14 formed on the bottom electrode layer 13, and a top electrode layer 15 formed on the piezoelectric layer 14. In practice, additional layers to the metal electrodes may be added to enhance resonator's functionality such as physical strength, passivation, temperature compensation and the like. When applying an alternating voltage at the resonant frequency between the two electrodes, a thickness longitudinal acoustic wave is formed in the piezoelectric layer/film and propagated along to the other layers in the BAW resonator. The function of the acoustic reflector is to create a very large acoustic impedance difference at the interface of the bottom electrode and the acoustic reflector, therefore a major portion of the acoustic wave energy is trapped in the resonator body containing the piezoelectric film and electrode layers. In one configuration, the acoustic reflector is formed of an air cavity. In another configuration, the acoustic reflector includes a plurality of alternating low and high acoustic impedance layers to isolate the resonator body from the bottom substrate to achieve the acoustic energy trapping in the resonator body. The latter type of BAW resonator is also referred to as solidly mounted resonator (SMR).

In operation, an alternating voltage is applied on the two electrodes of a BAW resonator and the electrical impedance of the BAW resonator is recorded with a sweep of frequency of the applied alternating voltage. The minimum and maximum of the curve of impedance magnitude correspond to series resonant frequency ($f_s$) and parallel resonant frequency ($f_p$) of the BAW resonator, respectively. The effective electromechanical coupling coefficient ($Kt^2_{eff}$) is calculated from the separation of the series resonant frequency and parallel resonant frequency. A larger separation of the series and parallel resonances indicates a greater $Kt^2_{eff}$, which is crucial to produce RF BAW filters with wide bandwidth. The width of the filter pass-band required for certain products define a lower limit for $Kt^2_{eff}$. A typical non-compensated BAW resonator has a $Kt^2_{eff}$ value about 6% to 7%. Because a certain portion of acoustic wave energy is stored in the first several layers of the acoustic reflector close to the bottom electrode, the $Kt^2_{eff}$ of an SMR is lower than that in an air-backed BAW resonator. Usually, a high value of $Kt^2_{eff}$ is desired for filter applications, since higher $Kt^2_{eff}$ improves insertion loss, and designers can trade off $Kt^2_{eff}$ for the Q factor. In many cases, a small sacrifice in $Kt^2_{eff}$, gives rise to a large boost in the Q factor, thereby leading to steeper skirts and better immunity to frequency variations due to process—thus leading to better manufacturing yield.

Resonant frequency of a BAW resonator is determined by the thicknesses and acoustic velocities of all layers in the propagation path of the longitudinal acoustic wave. The resonant frequency is mainly impacted by the thickness and acoustic velocity of the piezoelectric layer. The thicknesses and acoustic velocities of both electrodes relatively strongly influence the resonant frequency. However, the acoustic reflector of air has a negligible effect on the resonant frequency because it reflects almost all the acoustic energy back to the piezoelectric film. In the case the acoustic reflector having a plurality of alternating low and high acoustic impedance layers, only the topmost layer of the reflector containing a small fraction of the acoustic energy contribute to the resonant frequency to some extent.

Both the thicknesses and acoustic velocities of the piezoelectric, metal or dielectric layers in the BAW resonator structure change as temperature varies, so does the resonant frequency of the BAW resonator. Although the thickness expansion or contraction of the layers with temperature change plays a role in the resonant frequency variation with the temperature change, the acoustic-wave traveling velocity change of the layers with the temperature change is the dominant factor of the BAW resonant frequency dependence on temperature. The acoustic velocity of propagation in most of the materials currently employed in BAW resonator exhibits a negative temperature coefficient, i.e., the acoustic velocity becomes smaller with the increase of temperature, because the materials become "softened" (e.g., the inter-atomic forces is weakened) at a higher temperature. A decrease in the inter-atomic force results in a decrease in the elastic constant of the material with a concomitant decrease in the acoustic velocity. For example, the temperature coefficient of the acoustic velocity of aluminum nitride (AlN) is about −25 ppm/° C., and the temperature coefficient of the acoustic velocity of molybdenum (Mo) is about −60 ppm/° C.

The temperature coefficient of frequency (TCF) of a BAW resonator constructed by a known plurality of layers is determined by the thicknesses of the layers and their relative position and role in the resonator acoustic stack. For example in a BAW resonator consisting of an AlN layer and two Mo electrodes, the TCF of the resonator is close to −25 ppm/° C. if the thicknesses of both Mo electrodes are much thinner than that of the AlN. In the case of which the thicknesses of Mo electrodes are comparable with that of AlN, and the temperature coefficient of Mo provides a greater contribution to the TCF of the BAW resonator. Consequently, the resonant frequency of such BAW resonators has a TCF in the range from around −30 ppm/° C. to −40 ppm/° C. The TCF of the resonator becomes more negative if the thickness ratio of Mo to AlN in the resonator structure is increased. RF filters with BAW resonators typically have a band pass frequency response, and the TCF of the BAW resonators causes a reduction of the manufacturing yield of the RF filters, because such temperature coefficient causes a reduction of the temperature range over which the device or component incorporating the BAW resonators meets its pass bandwidth specification. In the most demanding duplexer applications, a low TCF is very important as it allows achieving specification-compliance over a wider range of temperature. Highly stable oscillators incorporating the BAW resonators have a much more stringent demand on the TCF of the BAW resonators, an extremely low or approaching zero TCF is desirable, because most oscillators are used to provide reference or timing signals and an ultra small variation of these signals with temperature is required.

Therefore, it is desirable to maximize the $Kt^2_{eff}$ of the BAW resonator while maintaining the good and stable temperature performance of the resonator. Hence, a heretofore unaddressed need exists in the art to address the aforementioned deficiencies and inadequacies.

SUMMARY OF THE INVENTION

In one aspect, the present invention relates to an acoustic wave resonator. In one embodiment, the acoustic wave resonator includes a substrate, an acoustic reflector formed on the substrate, a bottom electrode formed on the acoustic reflector, a piezoelectric layer formed on the bottom electrode, and a composite structure formed on the piezoelectric layer.

The composite structure has a first electrode formed on the piezoelectric layer, a temperature compensation layer formed on the first electrode, and a second electrode formed on the temperature compensation layer and electrically connected to the first electrode. The temperature compensation layer is formed to have one or more vias or trenches such that the first electrode and the second electrode are electrically connected to one another through the one or more vias or trenches.

In one embodiment, the temperature compensation layer has a temperature coefficient of frequency that is opposite to that of the piezoelectric layer.

In one embodiment, the temperature compensation layer is formed with a material of tellurium oxide, silicon oxide, or a combination of them.

In another aspect, the present invention relates to a method of fabricating an acoustic wave resonator. In one embodiment, the method includes the steps of forming an acoustic reflector layer on a substrate, forming a bottom electrode layer on the acoustic reflector layer and forming a piezoelectric layer on the bottom electrode layer.

Furthermore, the method includes the steps of forming a first electrode layer on the piezoelectric layer, forming a temperature compensation layer on the first electrode layer, forming one or more vias or trenches in the temperature compensation layer, depositing and patterning a conductive material on the temperature compensation layer to fill the one or more vias or trenches therein such that the conductive material filled in the one or more vias or trenches is in contact with the first electrode layer, planarizing the deposited and patterned conductive material until the top surface of the temperature compensation layer is exposed; and depositing and patterning a second electrode layer on the planarized temperature compensation layer such that the second electrode layer is connected to the first electrode layer at least through the one or more vias or trenches.

In one embodiment, the temperature compensation layer has a temperature coefficient of frequency that is opposite to that of the piezoelectric layer. The temperature compensation layer is formed with a material of tellurium oxide, silicon oxide, or a combination of them.

In yet another aspect, the present invention relates to an acoustic wave resonator. In one embodiment, the acoustic wave resonator comprises a substrate, an acoustic reflector formed on the substrate, and a composite structure having a first electrode formed on the acoustic reflector, a temperature compensation layer formed on the first electrode, and a second electrode formed on the temperature compensation layer and electrically connected to the first electrode. The acoustic wave resonator further comprises a piezoelectric layer formed on the second electrode of the composite structure, and a top electrode formed on the piezoelectric layer.

In one embodiment, the temperature compensation layer is formed to have one or more vias or trenches such that the first electrode and the second electrode are electrically connected to one another through the one or more vias or trenches.

In one embodiment, the temperature compensation layer has a temperature coefficient of frequency that is opposite to that of the piezoelectric layer.

In one embodiment, the temperature compensation layer is formed with a material of tellurium oxide, silicon oxide, or a combination of them.

In a further aspect, the present invention relates to a method of fabricating an acoustic wave resonator. In one embodiment, the method includes the steps of forming an acoustic reflector layer on a substrate, forming a composite structure on the acoustic reflector layer, forming a piezoelectric layer formed on the composite structure, and forming a top electrode formed on the piezoelectric layer. The step of forming the composite structure comprises the steps of forming a first electrode on the acoustic reflector layer, forming a temperature compensation layer having a tapered sidewall on the first electrode, and forming a second electrode layer on the temperature compensation layer such that the second electrode layer is connected to the first electrode layer. The composite structure has a tapered sidewall corresponding to the tapered sidewall of the temperature compensation layer;

In one embodiment, the step of forming the second electrode layer of the composite structure comprises the steps of forming one or more vias or trenches in the temperature compensation layer, depositing and patterning a first conductive material on the temperature compensation layer to fill the one or more vias or trenches therein such that the first conductive material filled in the one or more vias or trenches is in contact with the first electrode layer, planarizing the deposited and patterned first conductive material until the top surface of the temperature compensation layer is exposed, and depositing and patterning a second conductive material on the planarized temperature compensation layer to form the second electrode layer such that the second electrode layer is connected to the first electrode layer. The first and second conductive materials are identical or different.

In one embodiment, the one or more vias or trenches formed in the temperature compensation layer have a cross-sectionally tapered shape.

In yet a further aspect, the present invention relates to an acoustic wave resonator. In one embodiment, the acoustic wave resonator has a substrate, an acoustic reflector formed on the substrate, a bottom electrode formed on the acoustic reflector, a first piezoelectric layer formed on the bottom electrode, a composite structure formed on the first piezoelectric layer, a second piezoelectric layer formed on the composite structure, and a top electrode formed on the second piezoelectric layer. The composite structure comprises a first electrode formed on the first piezoelectric layer, a temperature compensation layer formed on the first electrode, and a second electrode formed on the temperature compensation layer and electrically connected to the first electrode.

In one embodiment, the temperature compensation layer is formed to have one or more vias or trenches such that the first electrode and the second electrode are electrically connected to one another through the one or more vias or trenches.

In one embodiment, the temperature compensation layer is formed with a material of tellurium oxide, silicon oxide, or a combination of them.

In one aspect, the present invention relates to a method of fabricating an acoustic wave resonator. In one embodiment, the method includes the steps of forming an acoustic reflector layer on a substrate, forming a bottom electrode on the acoustic reflector, forming a first piezoelectric layer formed on the bottom electrode, forming a composite structure on the first piezoelectric layer, forming a second piezoelectric layer on the composite structure, and forming a top electrode on the second piezoelectric layer. The step of forming the composite structure includes the steps of forming a first electrode on the first piezoelectric layer, forming a temperature compensation layer having a tapered sidewall on the first electrode; and forming a second electrode layer on the temperature compensation layer such that the second electrode layer is connected to the first electrode layer. The composite structure has a tapered sidewall corresponding to the tapered sidewall of the temperature compensation layer;

In one embodiment, the step of forming the second electrode layer of the composite structure comprises the steps of forming one or more vias or trenches in the temperature compensation layer, depositing and patterning a first conductive material on the temperature compensation layer to fill the one or more vias or trenches therein such that the first conductive material filled in the one or more vias or trenches is in contact with the first electrode layer, planarizing the deposited and patterned first conductive material until the top surface of the temperature compensation layer is exposed, and depositing and patterning a second conductive material on the planarized temperature compensation layer to form the second electrode layer such that the second electrode layer is connected to the first electrode layer. The first and second conductive materials are identical or different.

In one embodiment, the one or more vias or trenches formed in the temperature compensation layer have a cross-sectionally tapered shape.

In another aspect, the present invention relates to an acoustic wave resonator. In one embodiment, the acoustic wave resonator has a composite structure. The composite structure includes a first electrode, a temperature compensation layer formed on the first electrode, wherein the temperature compensation layer has one or more vias or trenches formed therein, and a second electrode formed on the temperature compensation layer and electrically connected to the first electrode at least through the one or more vias or trenches of the temperature compensation layer.

In one embodiment, the acoustic wave resonator further has an acoustic reflector formed on a substrate, a bottom electrode formed on the acoustic reflector, and a piezoelectric layer formed on the bottom electrode. The composite structure is disposed on the piezoelectric layer.

In another embodiment, the acoustic wave resonator further has an acoustic reflector formed on a substrate, a piezoelectric layer formed on the composite structure that in turn, is disposed on the acoustic reflector, and a top electrode formed on the piezoelectric layer.

In yet another embodiment, the acoustic wave resonator further has an acoustic reflector formed on a substrate, a bottom electrode formed on the acoustic reflector, a piezoelectric layer formed on bottom electrode, wherein the composite structure is embedded in the piezoelectric layer, and a top electrode formed on the piezoelectric layer. In one embodiment, the piezoelectric layer may also have a first piezoelectric layer and a second piezoelectric layer formed such that the composite structure is sandwiched between the first and second piezoelectric layer.

In an alternative aspect, the present invention relates to a method of fabricating an acoustic wave resonator comprising the step of forming a composite structure. In one embodiment, the step of forming the composite structure comprises the steps of forming a first electrode, forming a temperature compensation layer having a tapered sidewall on the first electrode, and forming a second electrode layer on the temperature compensation layer such that the second electrode layer is connected to the first electrode layer, In one embodiment, the step of forming the second electrode layer of the composite structure comprises the steps of forming one or more vias or trenches in the temperature compensation layer, depositing and patterning a first conductive material on the temperature compensation layer to fill the one or more vias or trenches therein such that the first conductive material filled in the one or more vias or trenches is in contact with the first electrode layer, planarizing the deposited and patterned first conductive material until the top surface of the temperature compensation layer is exposed, and depositing and patterning a second conductive material on the planarized temperature compensation layer to form the second electrode layer such that the second electrode layer is connected to the first electrode layer. The first and second conductive materials are identical or different.

In one embodiment, the one or more vias or trenches formed in the temperature compensation layer have a cross-sectionally tapered shape.

These and other aspects of the present invention will become apparent from the following description of the preferred embodiment taken in conjunction with the following drawings, although variations and modifications therein may be affected without departing from the spirit and scope of the novel concepts of the disclosure.

BRIEF DESCRIPTION OF THE DRAWINGS

The accompanying drawings illustrate one or more embodiments of the invention and, together with the written description, serve to explain the principles of the invention. Wherever possible, the same reference numbers are used throughout the drawings to refer to the same or like elements of an embodiment, and wherein.

DETAILED DESCRIPTION OF THE INVENTION

Figure 1:
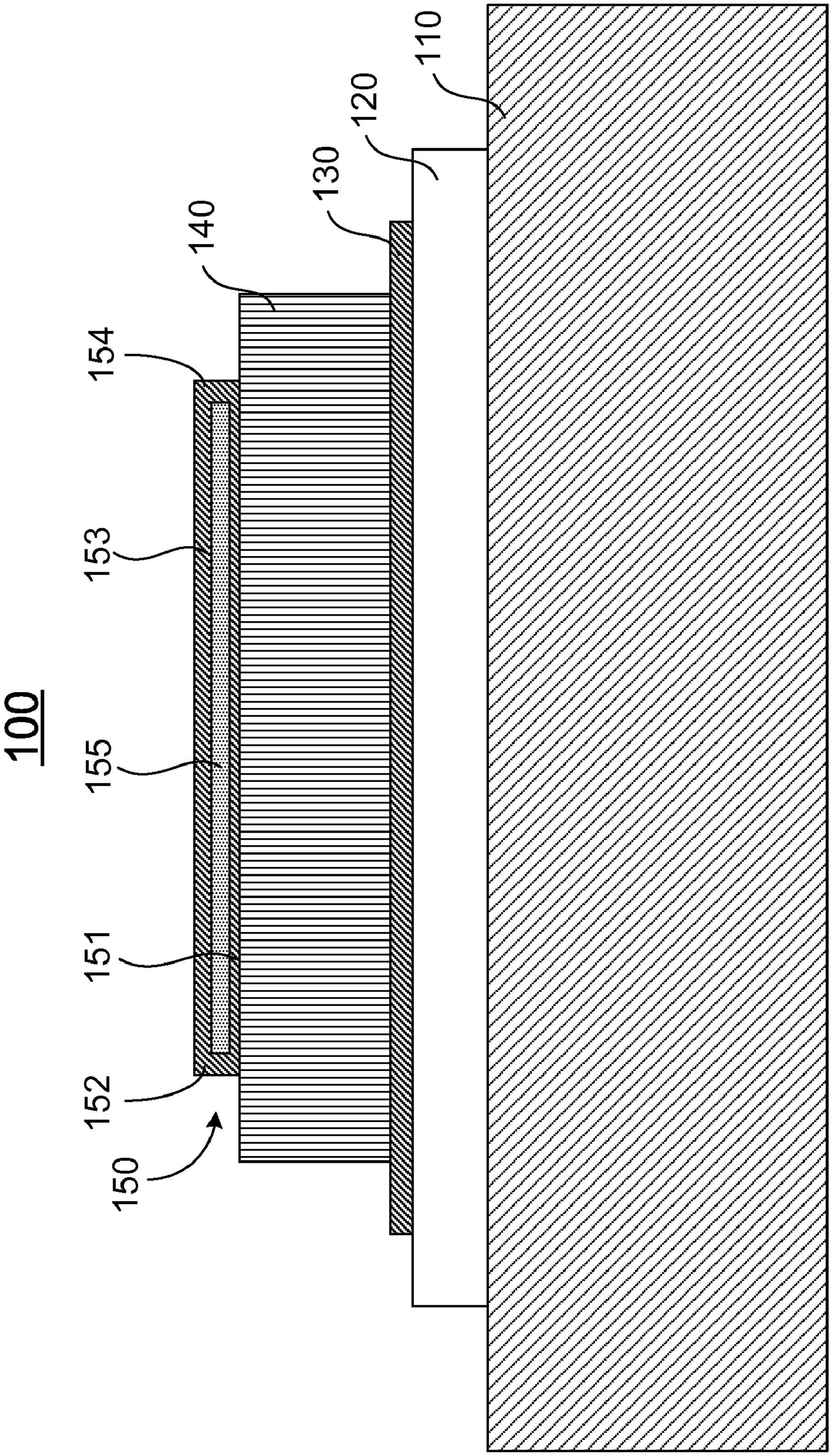
FIG. 1 shows schematically a cross-sectional view of an acoustic wave resonator according to one embodiment of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise.

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. The use of examples anywhere in this specification, including examples of any terms discussed herein, is illustrative only, and in no way limits the scope and meaning of the invention or of any exemplified term. Likewise, the invention is not limited to various embodiments given in this specification.

The terms "film" and "layer", as used herein, are interchangeable and refer to a thin sheet of a material deposited or spread over a surface.

The terms "via", as used herein, refers to a hole formed or etched in an interlayer which is then filled with a conductive metal material to provide an electrically connection between tow or more metal electrodes stacked on both sides of the interlayer.

As used herein, the terms "comprising," "including," "having," "containing," "involving," and the like are to be understood to be open-ended, i.e., to mean including but not limited to.

The description will be made as to the embodiments of the present invention in conjunction with the accompanying drawings of FIGS. 1-9. In accordance with the purposes of this invention, as embodied and broadly described herein, this invention, in one aspect, relates to a film bulk acoustic wave resonator that utilizes a composite structure having a temperature compensation layer formed such that no electrical field exists therein.

Since there are no temperature stable materials readily available in thin film form that are also piezoelectric, it is necessary to use composite structures having positive and negative coefficient characteristics. Temperature compensation can therefore be obtained using a composite layering of materials of normal negative coefficient with material (such as amorphous tellurium oxide and silicon oxide) that has a positive temperature coefficient. A number of methods are feasible for reducing the TCF of the BAW resonators. In one configuration, a temperature compensation (TC) layer can be placed outside of the metal electrodes (e.g., on top of a top electrode or under a bottom electrode). In this case, a relative thick TC layer is required to achieve a low or near zero TCF, because the TC layer is located outside of the piezoelectric excitation body with a piezoelectric layer, a top electrode and a bottom electrode. Since most available positive temperature coefficient materials are amorphous, and a thickness longitudinal wave propagating in the amorphous materials exhibits a higher acoustic attenuation than in the highly crystalline piezoelectric and electrode materials, a thick layer of a temperature compensation material loaded on the BAW resonator reduces the Q value of the entire resonator. The $Kt^2_{eff}$ of the resonator is also dramatically affected by the heavy loading of the additional thick material on the electrode.

In a SMR-type BAW resonator, besides the piezoelectric and metal electrodes layers, the additional acoustic reflector layers also contribute to the TCF of the resonator. The first several layers in the acoustic reflector containing small portion of the acoustic wave energy have a relative strong effect on the TCF of the resonator, and the farther the layer is away from the piezoelectric excitation body, the weaker effect it has on the TCF of the resonator. For example, an alternating silicon oxide (low acoustic impedance material) and tungsten (high acoustic impedance material) layers as the acoustic reflector are commonly in use in a BAW resonator. The first layer in the acoustic reflector which is in contact with the bottom electrode of the resonator is a silicon oxide ($SiO_2$) film. $SiO_2$ is a unique material that has a positive temperature coefficient of stiffness due to stretching of the Si—O chain upon increased temperature. The effect causes the material to become stiffer with increased temperature over a useful range of temperature. Accordingly, the acoustic velocity of propagation in $SiO_2$ exhibits a positive temperature coefficient. A BAW resonator having an AlN layer and two Mo electrodes (Mo/AlN/Mo sandwich structure) with the aforementioned acoustic reflector has lower TCF in magnitude than that of the similar air-backed Mo/AlN/Mo structure, due to the positive temperature coefficient of $SiO_2$. The closer the temperature compensation material is placed from the piezoelectric excitation body, the more effective the temperature compensation becomes.

Figure 11:
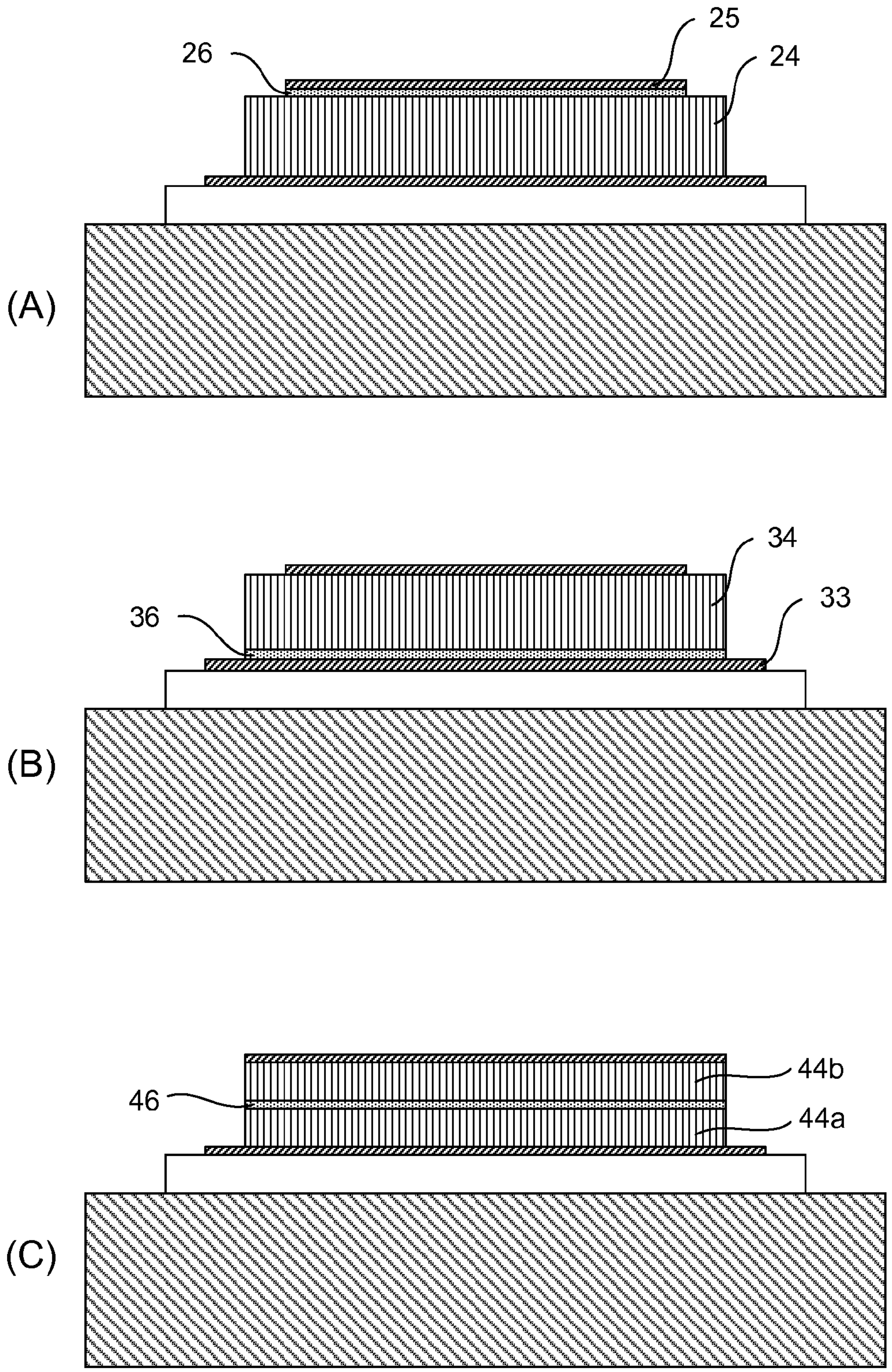
FIG. 11 (RELATED ART)
FIG. 11 shows cross-sectional views of three related film bulk acoustic wave resonators.

In order to obtain a marked improvement in the temperature dependence of the resonant frequency, it is advantageous to arrange a relatively thin TC layer between one of the two electrodes and the piezoelectric layer, or between two individual piezoelectric layers. Compared to the previous configuration, if the same temperature compensation material is used, a much thinner TC layer is needed to achieve the same TCF. It is possible to further improve the compensation effect by moving the TC layer closer to the high-stress regions. For example, as shown in FIG. 11A, a TC layer 26 is placed between a piezoelectric layer 24 and a top electrode layer 25. As shown in FIG. 11B, a TC layer 36 is placed between a piezoelectric layer 34 and a bottom electrode layer 33. As shown in FIG. 11C, a TC layer 46 is placed between two piezoelectric layers 44_a_ and 44_b_.

The method of arranging a TC layer at a position between the two electrodes is suitable for compensating the temperature dependence of the resonant frequency, however, a severe reduction in the value of the $Kt^2_{eff}$ of the resonator is observed. The $Kt^2_{eff}$ is calculated to be around 3% to 4% from the series and parallel resonant frequencies. The reduced $Kt^2_{eff}$ results in the pass band of the filters made of the BAW resonators to become narrower. This is contrary to the goal of achieving wider bandwidth in many applications. The reduction in the $Kt^2_{eff}$ is due to the reduction of the electrical field in the piezoelectric layer because of the electrical field forming in the TC layer. Because the TC layer is mostly formed by a high resistance material (typically insulating material), whenever a TC layer is placed between the two electrodes of a BAW resonator, the TC layer inside the resonator acts as a series capacitance, where a considerable portion of the voltage between the two electrodes drops at the TC layer in the series connection, thus the voltage drop at the piezoelectric layer is decreased and thus the electrical field in the piezoelectric layer is reduced. In a BAW resonator where only the piezoelectric layer is arranged between the two electrodes, the entire voltage drop would be in the piezoelectric layer, thus the electrical field in the piezoelectric layer is greater. The existence of electrical field formed in the TC layer results in a reduction of the electrical field in the piezoelectric layer and thus greatly affects $Kt^2_{eff}$. Therefore, the above mentioned approach can only be used for resonators and filters with small fractional bandwidth. While in an RF filter of wide bandwidth or a voltage controlled oscillator requiring a wide frequency tuning range, it is necessary to have a relatively large $Kt^2_{eff}$ of a BAW resonator.

According to the present invention, by incorporating a composite structure having a temperature compensation layer such that no electrical field exists therein into a thin film bulk acoustic wave resonator, the effective electromechanical coupling coefficient $Kt^2_{eff}$ of the bulk acoustic wave resonator can be maximized, thereby, improving the temperature stability of the bulk acoustic wave resonator.

Referring now to FIG. 1, a thin film acoustic wave resonator 100 is shown according to one embodiment of the present invention. In this exemplary embodiment, the acoustic wave resonator 100 includes a substrate 110, an acoustic reflector 120 formed on the substrate 110, a bottom electrode 130 formed on the acoustic reflector 120, a piezoelectric layer 140 formed on the bottom electrode 130, and a composite structure 150 formed on the piezoelectric layer 140.

The composite structure 150 has a first electrode 151 formed on the piezoelectric layer 140, a temperature compensation layer 155 formed on the first electrode 151, and a second electrode 153 formed on the temperature compensation layer 155 and electrically connected to the first electrode 151. Preferably, the temperature compensation layer 155 has a temperature coefficient of frequency that is opposite to that of the piezoelectric layer 140. The temperature compensation layer is formed with a material of tellurium oxide, silicon oxide, or a combination of them.

As shown in FIG. 1, the first electrode 151 and the second electrode 153 are connected to each other at edge portions 152 and 154.

Additionally, the temperature compensation layer 155 is formed to have one or more vias or trenches (not shown) such that the first electrode 151 and the second electrode 153 are electrically connected to one another through the one or more vias or trenches. The one or more vias or trenches are preferred to locate at the periphery of the active area of the acoustic wave resonator 100 and avoid interference with the acoustic vibration of the acoustic wave resonator 100. They could scatter at a plurality of spaced part locations adjacent the periphery of the active resonator area or connect to each other to form a closed or open contour along the periphery of the active area of the resonator. Since the first electrode 151 is connected and actually shorted to the second electrode 153 through the one or more vias or trenches, the first and the second electrodes 151 and 153 have the same electrical potential. Therefore, the electrical field in the TC layer 155 which is embedded between the first and second electrodes 151 and 153 is close to zero. The voltage drop between the first electrodes 151 and the bottom electrode 130 of the acoustic wave resonator 100 is entirely at the piezoelectric layer 140, thus the $Kt^2_{eff}$ of the acoustic wave resonator 100 is maximized. Additionally, the temperature compensation of the acoustic wave resonator 100 is slightly disturbed by the additional first electrode 151 proximate to the piezoelectric layer 140. Thus, the first electrode 151 is preferred to be relatively thin to minimize its load impact on the TCF of the acoustic wave resonator 100 and also have an acceptable electrical resistance.

Figure 9:
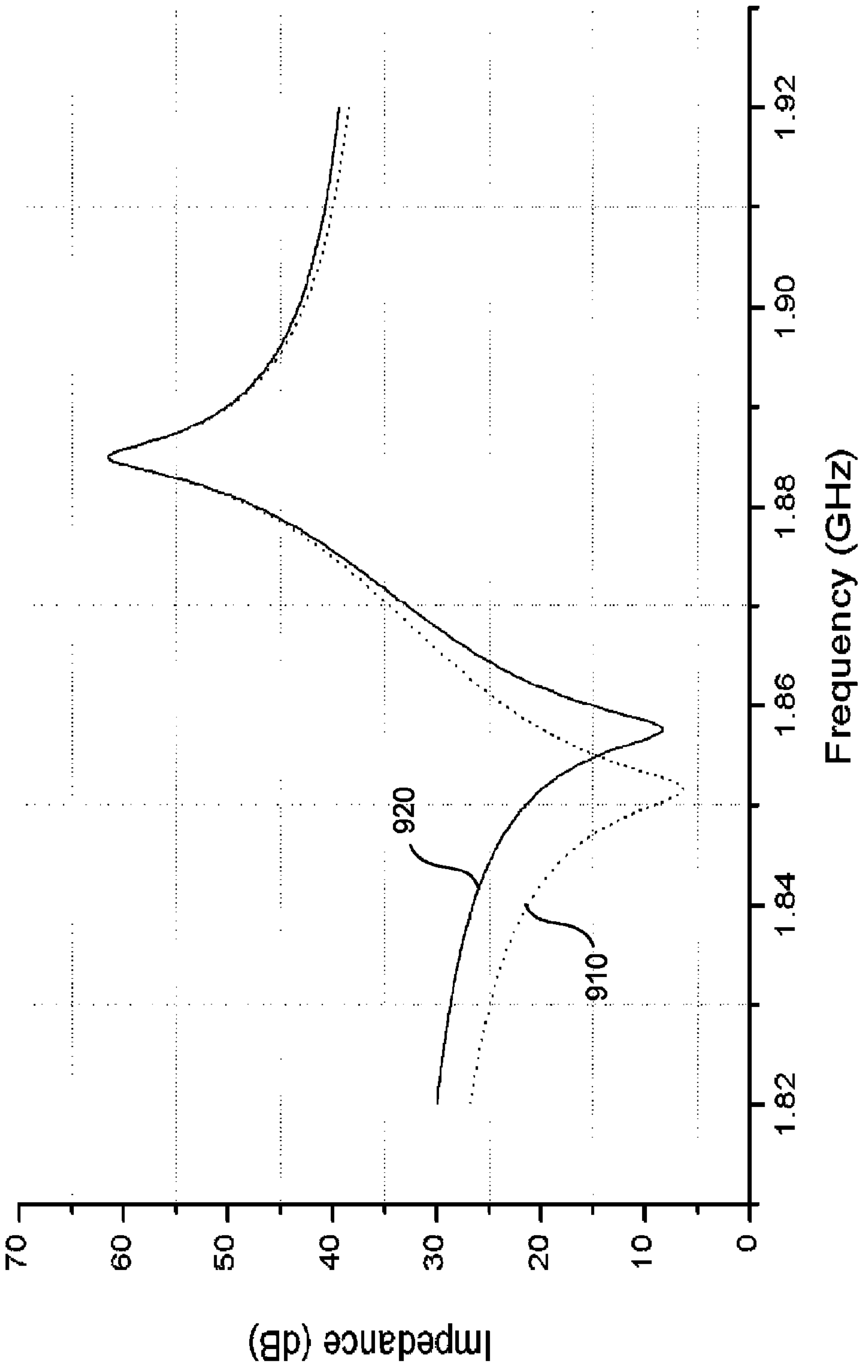
FIG. 9 shows a frequency response of an acoustic wave resonator according to one embodiment of the present invention.
Figure 10:
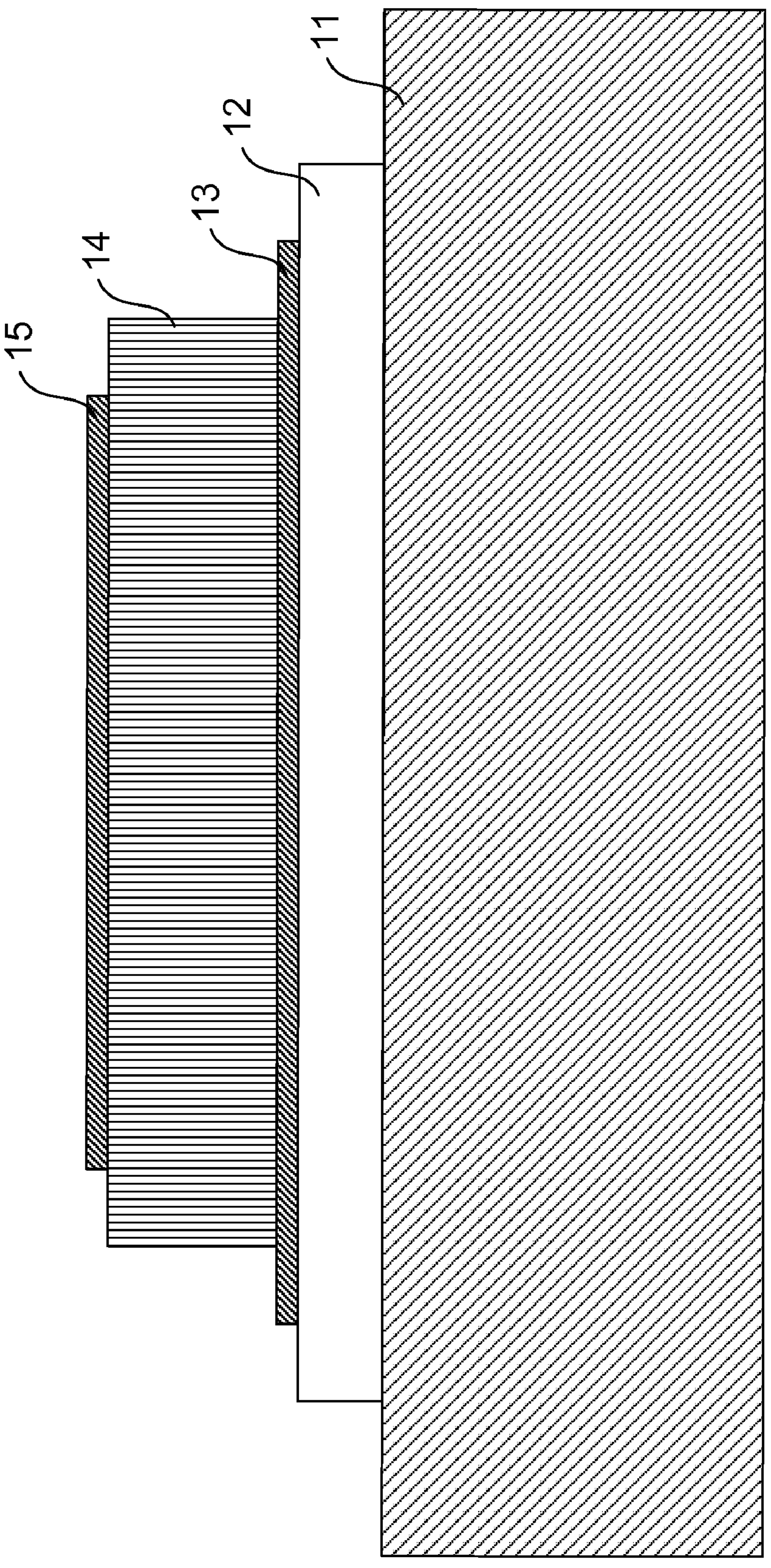
FIG. 10 (RELATED ART)
FIG. 10 shows a cross-sectional view of a conventional film bulk acoustic wave resonator.

FIG. 9 shows a frequency response of the acoustic wave resonator 100, where the dotted line describes the frequency response of the temperature compensated resonator with the above mentioned structure. The effective electromechanical coupling coefficient $Kt^2_{eff}$ of the acoustic wave resonator 100 is larger than that of the conventional temperature compensated resonator where the first electrode layer 151 is disconnected from the second electrode layer 153. Accordingly, the temperature stability of the acoustic wave resonator 100 is improved significantly.

Figure 2:
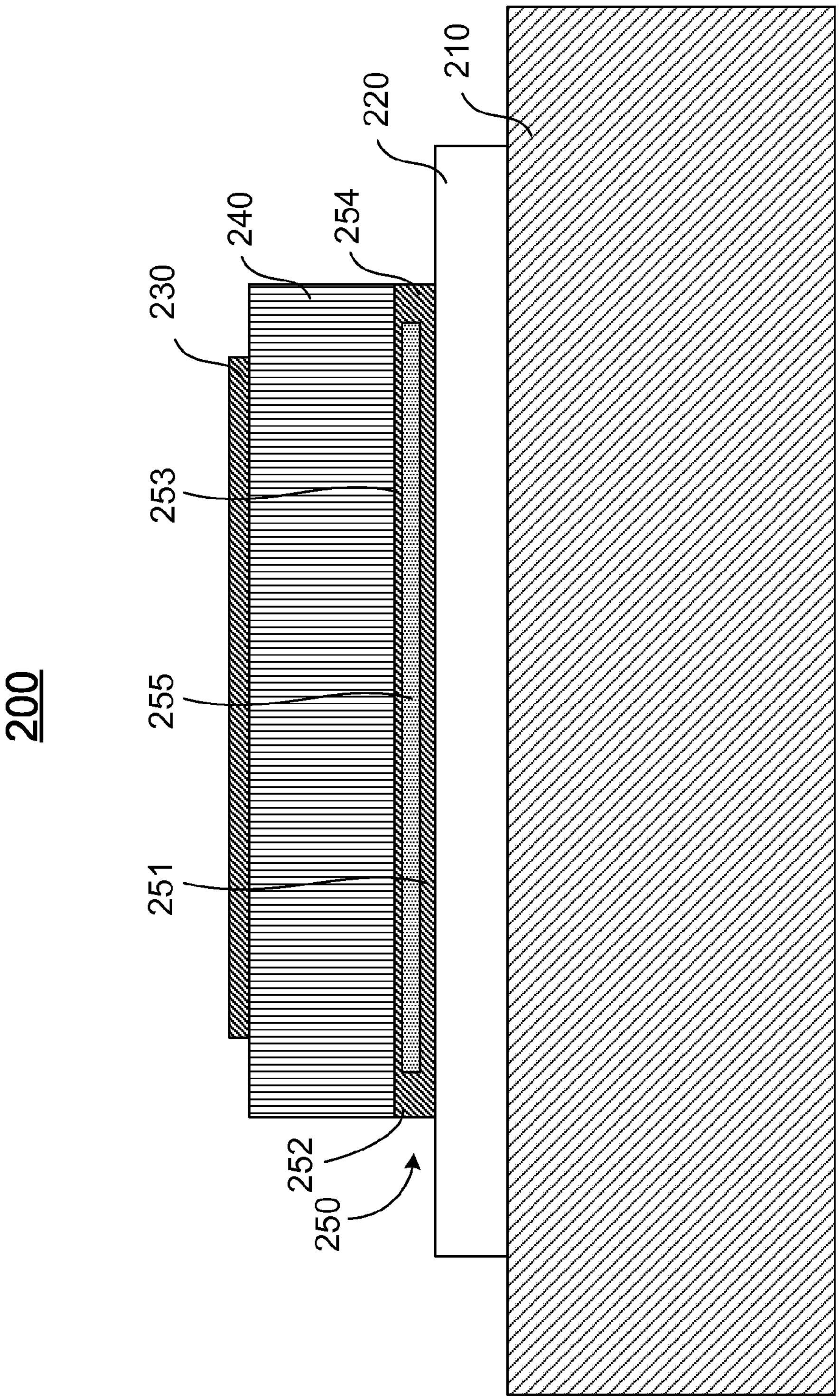
FIG. 2 shows schematically a cross-sectional view of an acoustic wave resonator according to another embodiment of the present invention.

Referring to FIG. 2, an acoustic wave resonator 200 is shown according to another embodiment of the present invention. The acoustic wave resonator 200 has a substrate 210, an acoustic reflector 220 formed on the substrate 210, and a composite structure 250 having a first electrode 251 formed on the acoustic reflector 220, a temperature compensation layer 255 formed on the first electrode 251, and a second electrode 253 formed on the temperature compensation layer 255 and electrically connected to the first electrode 251 so that there is no electrical field existed in the temperature compensation layer 255. The acoustic wave resonator 200 also has a piezoelectric layer 240 formed on the second electrode 253 of the composite structure 250, and a top electrode 230 formed on the piezoelectric layer 240.

As shown in FIG. 2, the first electrode 251 and the second electrode 253 are connected to each other at edge portions 252 and 254. The temperature compensation layer 255 may have one or more vias or trenches (not shown) formed therein such that the first electrode 251 and the second electrode 253 are electrically connected to one another through the one or more vias or trenches. Preferably, the one or more vias or trenches are formed at the periphery of the active area of the acoustic wave resonator 200 and avoid interference with the acoustic vibration of the acoustic wave resonator 200. Additionally, the second electrode 253 proximate to the piezoelectric layer 240 is preferred to relatively thin to minimize its load impact on the TCF of the acoustic wave resonator 200 and also have an acceptable electrical resistance.

Similarly, the temperature compensation layer 255 has a temperature coefficient of frequency that is opposite to that of the piezoelectric layer 240. Further, the temperature compensation layer 255 is formed with a material of tellurium oxide, silicon oxide, or a combination of them.

Figure 3:
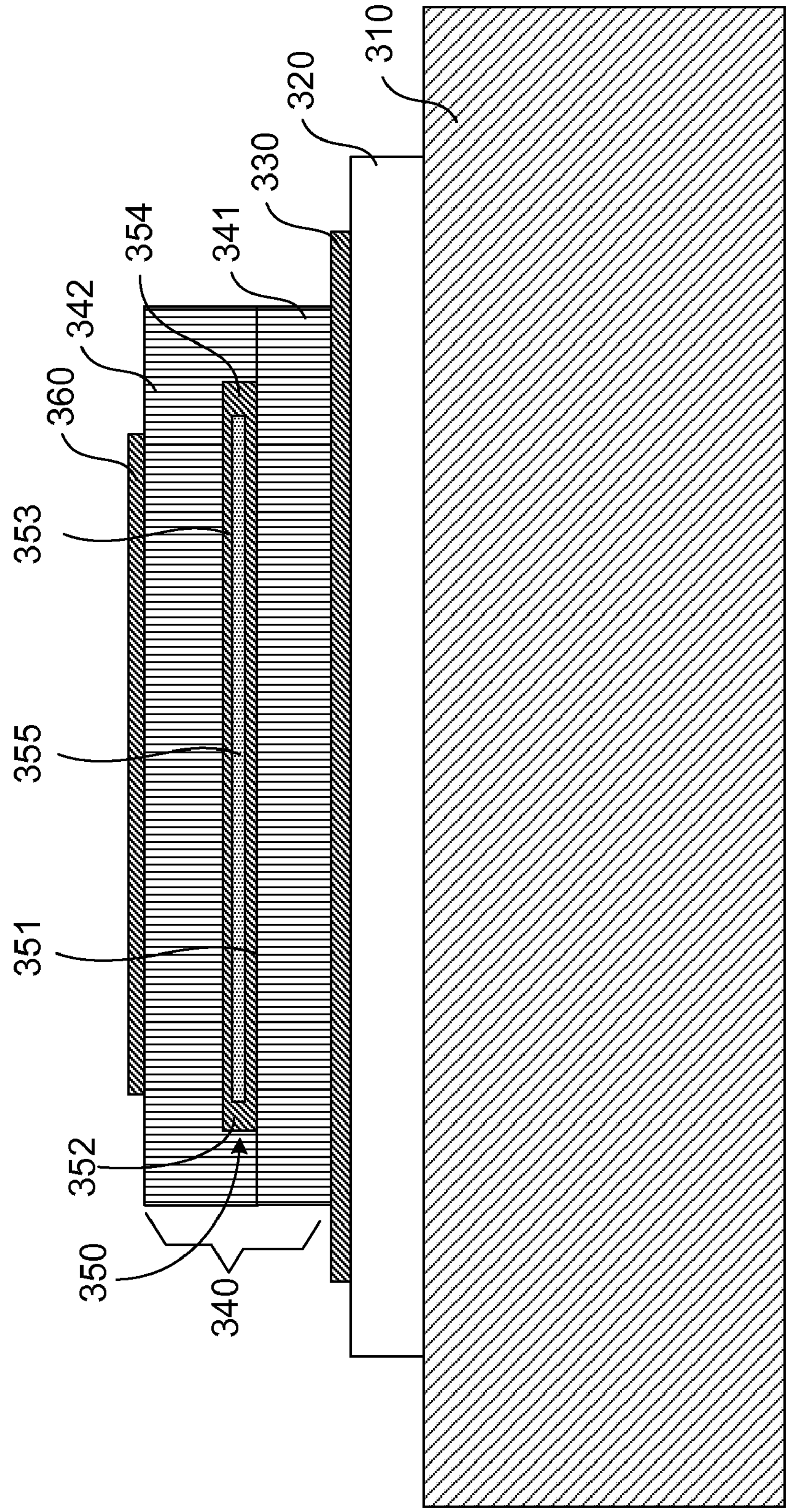
FIG. 3 shows schematically a cross-sectional view of an acoustic wave resonator according to yet another embodiment of the present invention.

FIG. 3 shows an acoustic wave resonator 300 according to yet another embodiment of the present invention. The acoustic wave resonator 300 includes a substrate 310, an acoustic reflector 320 formed on the substrate 310, a bottom electrode 330 formed on the acoustic reflector 320, a first piezoelectric layer 341 formed on the bottom electrode 330, a composite structure 350 formed on the first piezoelectric layer 341, a second piezoelectric layer 342 formed on the composite structure 350, and a top electrode 360 formed on the second piezoelectric layer 342. The composite structure comprises a first electrode 351 formed on the first piezoelectric layer 341, a temperature compensation layer 355 formed on the first electrode 351, and a second electrode 353 formed on the temperature compensation layer 355 and electrically connected to the first electrode 351 so that there is no electrical field existing in the temperature compensation layer 355. As shown in FIG. 3, the first electrode 351 and the second electrode 353 are connected to each other at edge portions 352 and 354. The temperature compensation layer may have one or more vias or trenches (not shown) such that the first electrode 351 and the second electrode 353 are electrically connected to one another through the one or more vias or trenches. Additionally, the first electrode 351 proximate to the piezoelectric layer 341 and the second electrode 353 proximate to the piezoelectric layer 342 are preferred to relatively thin to minimize its load impact on the TCF of the acoustic wave resonator 300 and also have an acceptable electrical resistance.

Similarly, the temperature compensation layer 355 has a temperature coefficient of frequency that is opposite to that of the piezoelectric layer 340. Further, the temperature compensation layer 355 is formed with a material of tellurium oxide, silicon oxide, or a combination of them.

Figure 4:
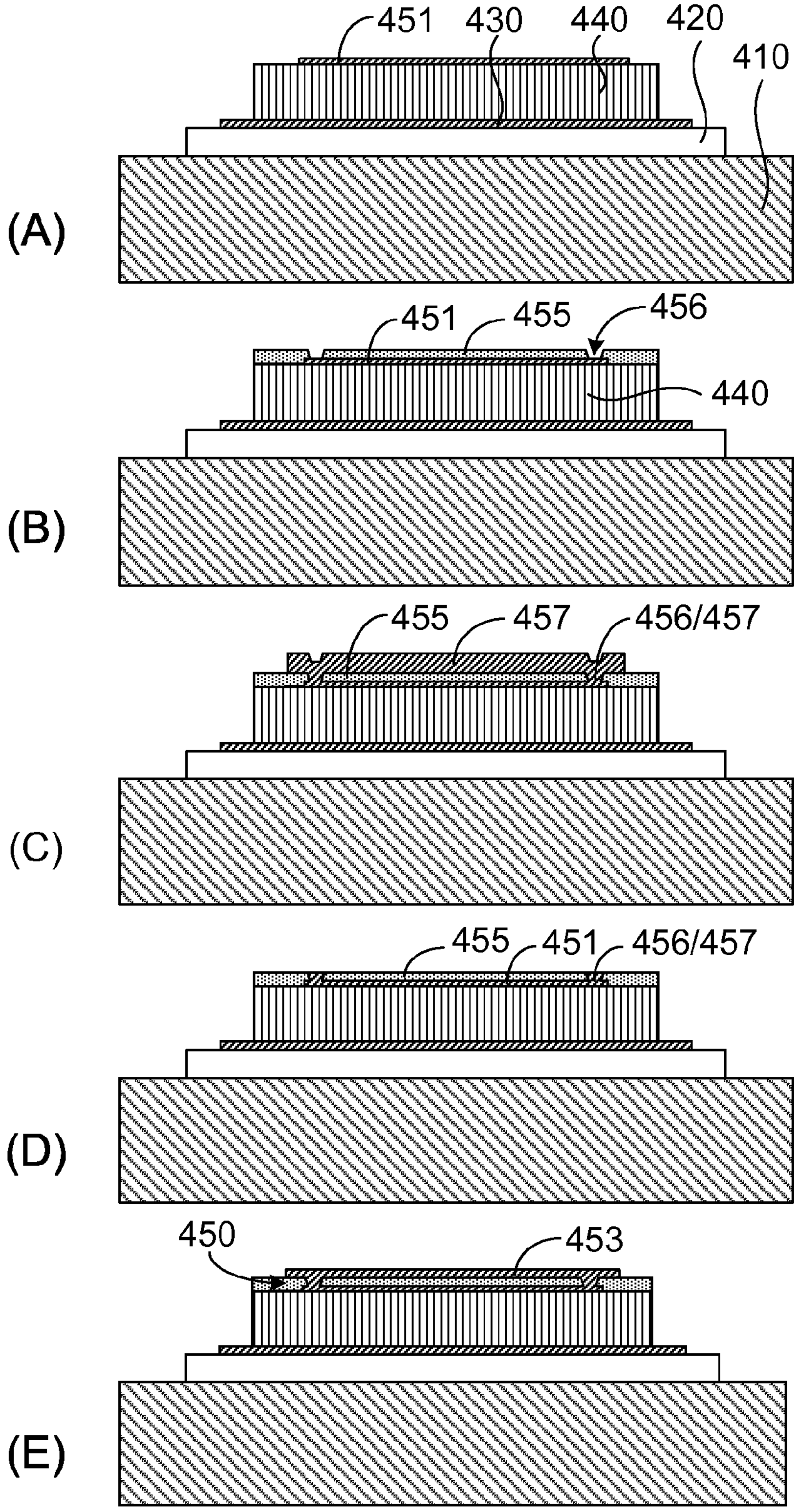
FIG. 4 illustrates schematically partial processes of fabricating an acoustic wave resonator according to one embodiment of the present invention.

Referring to FIG. 4, a process/method of fabricating an acoustic wave resonator is shown according to one embodiment of the present invention. The process includes forming a multilayered structure, as shown in FIG. 4A. The multilayered structure has a substrate 410, an acoustic reflector layer 420 formed on a substrate 410, a bottom electrode layer 430 formed on the acoustic reflector layer 420, a piezoelectric layer 440 on the bottom electrode layer 430, and a first electrode layer 451 on the piezoelectric layer 440. Various processing steps, such as deposition, removal, patterning and/or planarization can be employed to form these layers.

Further, a temperature compensation layer 455 is formed on the first electrode layer 451. By etching off the temperature compensation layer 455, one or more vias or trenches 456 are formed in the temperature compensation layer 455, as shown in FIG. 4B. The one or more vias or trenches 456 are adapted for connecting the first electrode 451 and the second electrode 453 separated by the temperature compensation layer 455. Preferably, the one or more vias or trenches 456 are formed in the periphery of the temperature compensation layer 455, and have a cross-sectionally tapered shape. Next, a conductive material 457 is deposited and patterned on the temperature compensation layer 455. As a result, the one or more vias or trenches 456 are fully filled with the conductive material 457, such that the conductive material 457 filled in the one or more vias or trenches 456 is in contact with the first electrode layer 451, as shown in FIG. 4C. The deposited and patterned conductive material 457 is then planarized until the top surface of the temperature compensation layer 455 is exposed, as shown in FIG. 4D. Finally, a second electrode layer 453 is deposited and patterned on the planarized temperature compensation layer 455 to form the composite structure 450, such that the second electrode layer 453 is connected to the first electrode layer 451 at least through the one or more vias or trenches 456, as shown in FIG. 4E. According to the process, the acoustic wave resonator is fabricated such that the composite structure 450 is on the piezoelectric layer 440, which is corresponding to the acoustic wave resonator 100 shown in FIG. 1.

Figure 5:
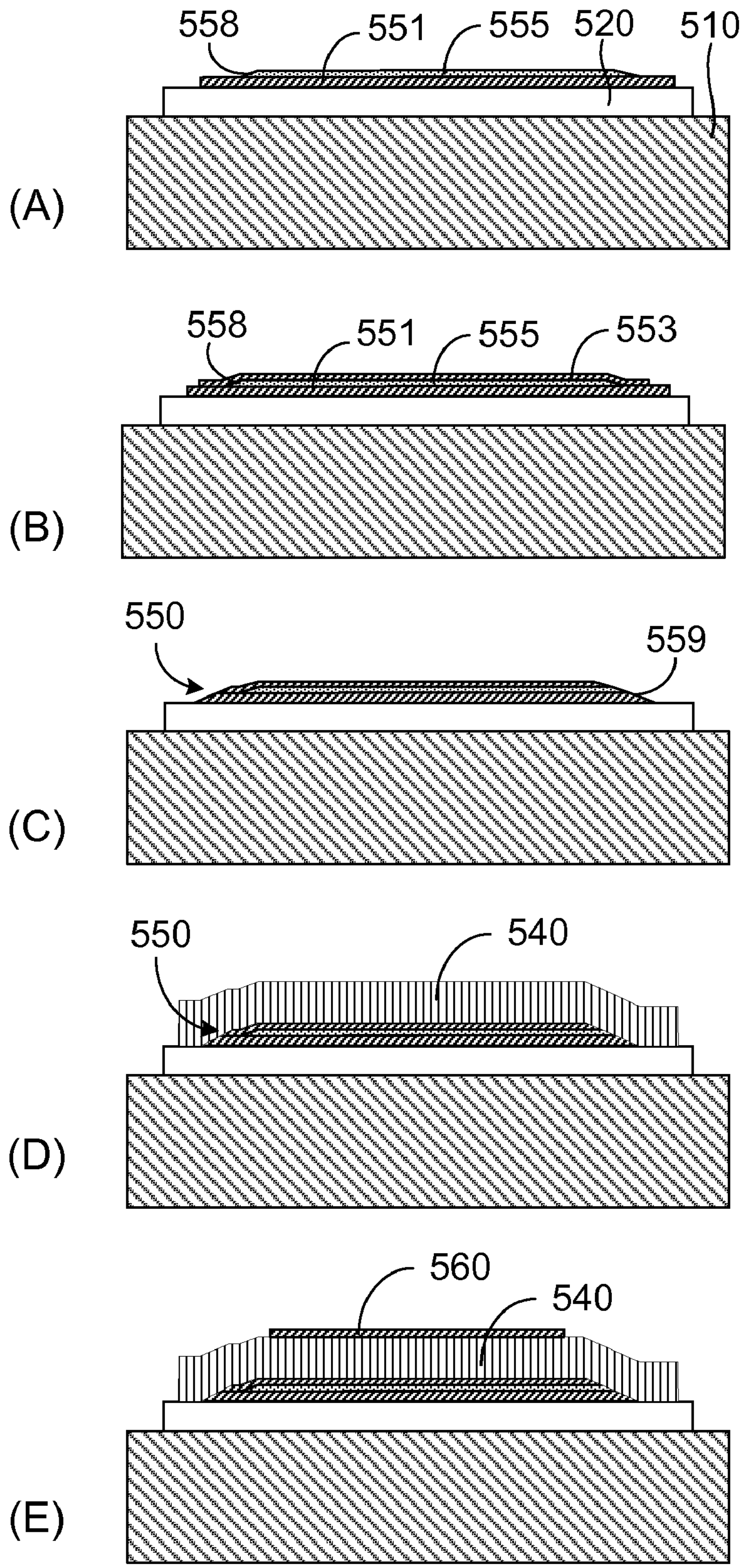
FIG. 5 illustrates schematically partial processes of fabricating an acoustic wave resonator according to another embodiment of the present invention.

Referring to FIG. 5, a process/method of fabricating an acoustic wave resonator is shown according to another embodiment of the present invention. In this exemplary embodiment, the method includes the steps of forming an acoustic reflector layer 520 on a substrate 510, forming a composite structure 550 on the acoustic reflector layer 520.

The composite structure 550 is formed according to the following steps: at first, a first electrode 551 is formed on the acoustic reflector layer 520. Then, a temperature compensation layer 555 is formed to have a tapered sidewall 558 on the first electrode 551, as shown in FIG. 5A. A second electrode layer 553 is subsequently on the temperature compensation layer 555 and extended to the first electrode 551 along the tapered sidewall 558 of the temperature compensation layer 555 such that the second electrode layer 553 is connected to the first electrode layer 551, as shown in FIG. 5B. Then, etching process is performed on the first electrode layer 551, the temperature compensation layer 555 and the second electrode layer 553 to form the composite structure 550 having a tapered sidewall 559 that is corresponding to the tapered sidewall 558 of the temperature compensation layer 555, as shown in FIG. 5C. The tapered profile of the sidewall 559 of the composite structure 550 is in favor of eliminating cracks and discontinuity in the piezoelectric layer 540 as well maintaining highly oriented grains in the piezoelectric material, in particular, in the end region of the composite structure 550, as shown in FIG. 5D. Next, a top electrode 560 is formed on the piezoelectric layer 540, as shown in FIG. 5E.

Figure 6:
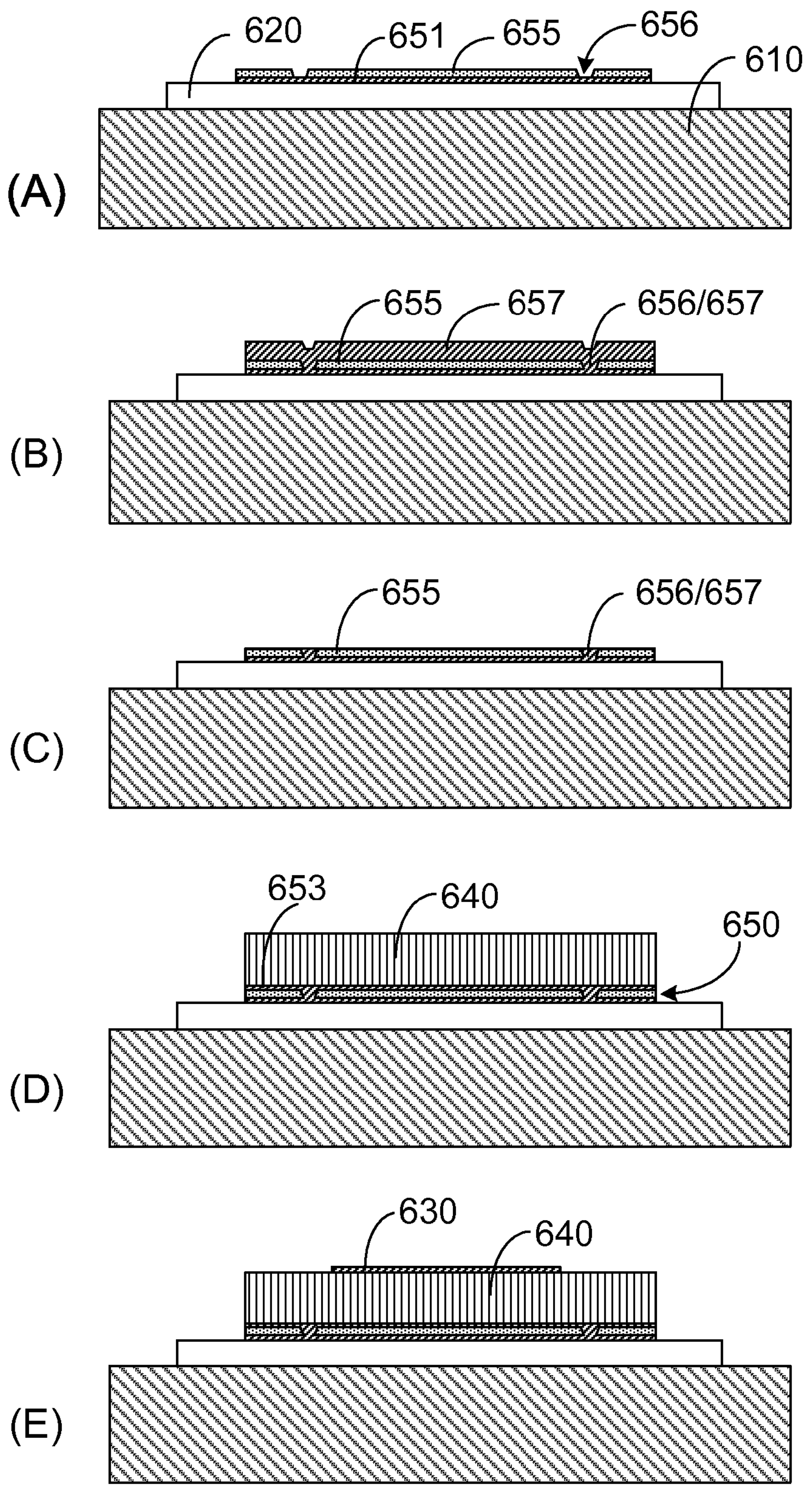
FIG. 6 illustrates schematically partial processes of fabricating an acoustic wave resonator according to another embodiment of the present invention.

Referring to FIG. 6, a process/method of fabricating an acoustic wave resonator is shown according to yet another embodiment of the present invention. The process includes, among other things, forming an acoustic reflector layer 620 on a substrate 610, and forming a composite structure 650 on the acoustic reflector layer 620, forming a piezoelectric layer 640 on the composite structure 650, as shown in FIG. D, and forming a top electrode layer 630 on the piezoelectric layer 640, as shown in FIG. 6E. Various processing steps, such as deposition, removal, patterning and/or planarization can be employed to form these layers.

The process of forming the composite structure 650 is similar to that of forming the composite structure 450 shown in FIG. 4. At first, a first electrode 651 is formed on the acoustic reflector layer 620, and a temperature compensation layer 655 is then formed on the first electrode layer 651. By etching off the temperature compensation layer 655, one or more vias or trenches 656 are formed in the temperature compensation layer 655, as shown in FIG. 6A. The one or more vias or trenches 656 are adapted for connecting the first electrode 651 and the second electrode 653 separated by the temperature compensation layer 655. Preferably, the one or more vias or trenches 656 are formed in the periphery of the temperature compensation layer 655, and have a cross-sectionally tapered shape. Next, a conductive material 657 is deposited and patterned on the temperature compensation layer 655. As a result, the one or more vias or trenches 656 are fully filled with the conductive material 657, such that the conductive material 657 filled in the one or more vias or trenches 656 is in contact with the first electrode layer 651, as shown in FIG. 6B. The deposited and patterned conductive material 657 is then planarized until the top surface of the temperature compensation layer 655 is exposed, as shown in FIG. 6C. Next, a second electrode layer 653 is deposited and patterned on the planarized temperature compensation layer 655 to form the composite structure 650, where the second electrode layer 653 is connected to the first electrode layer 651 at least through the one or more vias or trenches 656, as shown in FIG. 6E.

According to the processes shown in FIGS. 5 and 6, the acoustic wave resonator is fabricated such that the composite structure 550/650 is under the piezoelectric layer 540/640, which is corresponding to the acoustic wave resonator 200 shown in FIG. 2.

Figure 7:
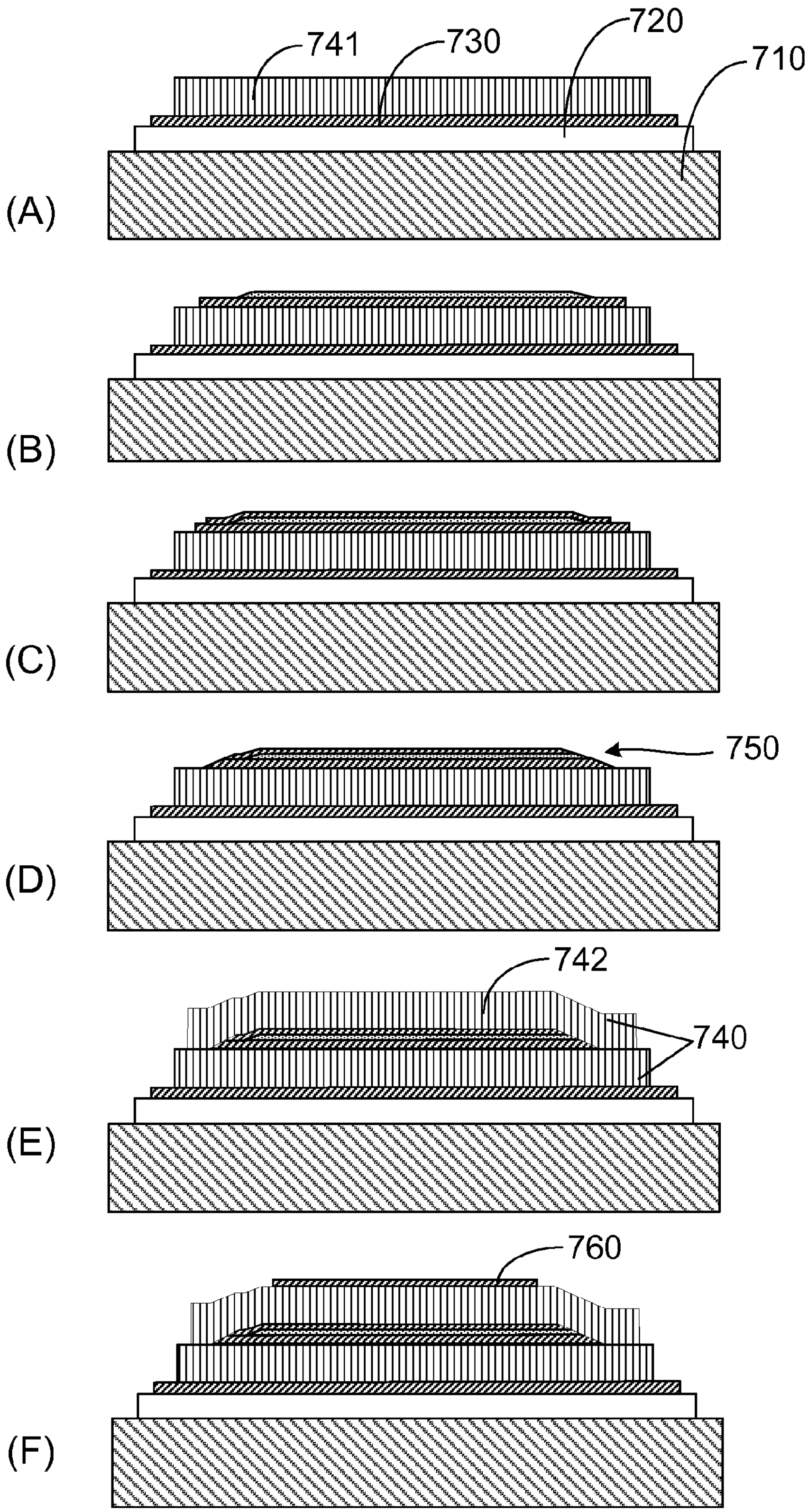
FIG. 7 illustrates schematically partial processes of fabricating an acoustic wave resonator according to yet another embodiment of the present invention.

FIG. 7 shows a process/method of fabricating an acoustic wave resonator according to one embodiment of the present invention. According to the process, the acoustic wave resonator is fabricated such that a composite structure 750 having a tapered sidewall is embedded inside a piezoelectric layer 740, which is corresponding to the acoustic wave resonator 300 shown in FIG. 3. The piezoelectric layer 740 may have a first piezoelectric layer 741 and a second piezoelectric layer 742.

Specifically, the process includes forming a multilayered structure, as shown in FIG. 7A. The multilayered structure has a substrate 710, an acoustic reflector layer 720 formed on a substrate 710, a bottom electrode layer 730 formed on the acoustic reflector layer 720, and a first piezoelectric layer 741 formed on the bottom electrode layer 730. Then, the sidewall tapered composite structure 750 is formed on the piezoelectric layer 741, as shown in FIGS. 7B-7D. Next, a second piezoelectric layer 742 is formed on the sidewall tapered composite structure 750, as shown in FIG. 7E, and a top electrode 760 is formed on the second piezoelectric layer 742. Various processing steps, such as deposition, removal, patterning and/or planarization can be employed to form these layers. For the formation of the sidewall tapered composite structure 750, the process is same as that of forming the sidewall tapered composite structure 550 shown in FIG. 5.

Figure 8:
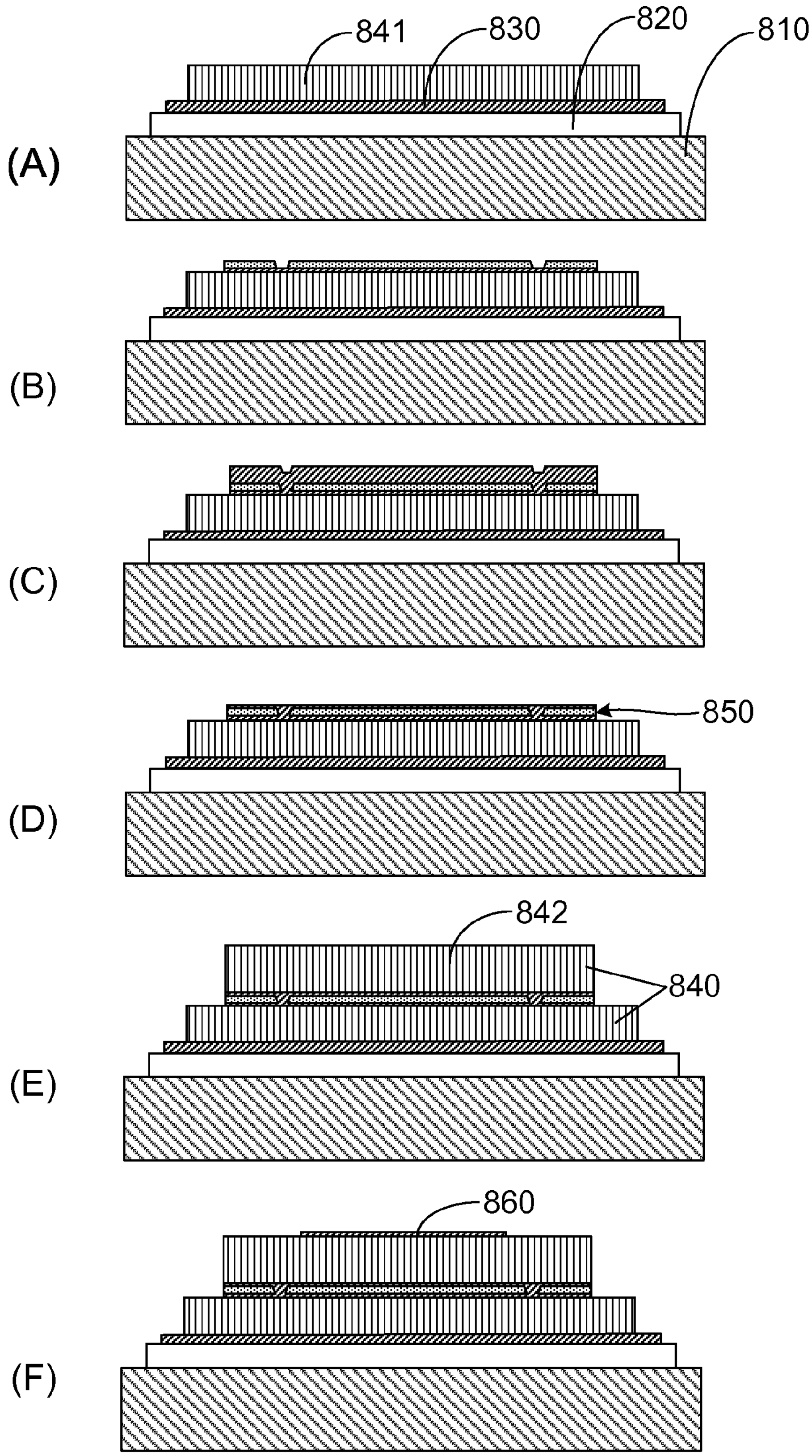
FIG. 8 illustrates schematically partial processes of fabricating an acoustic wave resonator according to an alternative embodiment of the present invention.

Referring to FIG. 8, process/method of fabricating an acoustic wave resonator is shown according to another embodiment of the present invention. According to the process, the acoustic wave resonator is fabricated such that a composite structure 850 is embedded inside a piezoelectric layer 840, which is corresponding to the acoustic wave resonator 300 shown in FIG. 3. The piezoelectric layer 840 may have a first piezoelectric layer 841 and a second piezoelectric layer 842. As shown in FIG. 8, the process includes forming an acoustic reflector layer 820 on a substrate 810, forming a bottom electrode layer 830 on the acoustic reflector layer 820, and forming a first piezoelectric layer 841 on the bottom electrode layer 830, as shown in FIG. 8A. Then, a composite structure 850 is formed on the piezoelectric layer 841, as shown in FIGS. 8B-8D. Next, a second piezoelectric layer 842 is formed on the composite structure 850, as shown in FIG. 8E, and a top electrode 860 is formed on the second piezoelectric layer 842. Various processing steps, such as deposition, removal, patterning and/or planarization can be employed to form these layers. For the formation of the composite structure 850, the process is same as that of forming the composite structure 650 shown in FIG. 6.

FIG. 9 shows typical frequency responses of the temperature compensated thin film acoustic wave resonator according to embodiments of the present invention. The dotted line 910 shows the frequency response of the temperature compensated thin film acoustic wave resonator according to embodiments of the present invention, where the two electrode layers are shorted through vias or trenches embedded in the temperature compensation layer and sidewalls surrounding the temperature compensation layer. The solid line 920 shows the frequency response of a temperature compensated thin film acoustic wave resonator where thin metal layer is disconnected from the electrode layer. The peaks (representing $f_p$) of the impedance curves are located in the same frequency, but the valleys (representing $f_s$) of the impedance curves are located about 7 MHZ apart.

Briefly, the present invention, among other things, recites a thin film bulk acoustic wave resonator that utilizes a composite structure having a first electrode, a temperature compensation layer formed on the first electrode, and a second electrode formed on the temperature compensation layer and electrically connected to the first electrode such that no electrical field exists in the temperature compensation layer, thereby maximizing the effective electromechanical coupling coefficient $Kt^2_{eff}$ of the bulk acoustic wave resonator, and improving the temperature stability of the bulk acoustic wave resonator.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An acoustic wave resonator, comprising a composite structure comprising:
(a) a first electrode;
(b) a temperature compensation layer formed on the first electrode, wherein the temperature compensation layer has one or more vias or trenches formed therein; and
(c) a second electrode formed on the temperature compensation layer and electrically connected to the first electrode at least through the one or more vias or trenches of the temperature compensation layer.

2. The acoustic wave resonator of claim 1, further comprising:
(a) an acoustic reflector formed on a substrate;
(b) a bottom electrode formed on the acoustic reflector; and
(c) a piezoelectric layer formed on the bottom electrode, wherein the composite structure is disposed on the piezoelectric layer.

3. The acoustic wave resonator of claim 1, further comprising:
(a) an acoustic reflector formed on a substrate;
(b) a piezoelectric layer formed on the composite structure that in turn, is disposed on the acoustic reflector; and
(c) a top electrode formed on the piezoelectric layer.

4. The acoustic wave resonator of claim 1, further comprising:
(a) an acoustic reflector formed on a substrate;
(b) a bottom electrode formed on the acoustic reflector;
(c) a piezoelectric layer formed on bottom electrode, wherein the composite structure is embedded in the piezoelectric layer; and
(d) a top electrode formed on the piezoelectric layer.

5. The acoustic wave resonator of claim 4, wherein the piezoelectric layer comprises a first piezoelectric layer and a second piezoelectric layer formed such that the composite structure is sandwiched between the first and second piezoelectric layer.

6. An acoustic wave resonator, comprising:
(a) a substrate;
(b) an acoustic reflector formed on the substrate;
(c) a bottom electrode formed on the acoustic reflector;
(d) a first piezoelectric layer formed on the bottom electrode;
(e) a composite structure formed on the first piezoelectric layer, comprising:
(i) a first electrode formed on the first piezoelectric layer;

(ii) a temperature compensation layer formed on the first electrode; and (iii) a second electrode formed on the temperature compensation layer and electrically connected to the first electrode;

(f) a second piezoelectric layer formed on the second electrode of the composite structure; and (g) a top electrode formed on the second piezoelectric layer;

wherein the temperature compensation layer is formed to have one or more vias or trenches such that the first electrode and the second electrode are electrically connected to one another through the one or more vias or trenches.

7. The acoustic wave resonator of claim 6, wherein the temperature compensation layer has a temperature coefficient of frequency that is opposite to that of the piezoelectric layer.

8. The acoustic wave resonator of claim 6, wherein the temperature compensation layer is formed with a material of tellurium oxide, silicon oxide, or a combination of them.

9. An acoustic wave resonator, comprising:

(a) a substrate;

(b) an acoustic reflector formed on the substrate;

(c) a composite structure formed on the acoustic reflector, comprising:

(i) a first electrode formed on the acoustic reflector;

(ii) a temperature compensation layer formed on the first electrode; and (iii) a second electrode formed on the temperature compensation layer and electrically connected to the first electrode;

(d) a piezoelectric layer formed on the second electrode of the composite structure; and (e) a top electrode formed on the piezoelectric layer;

wherein the temperature compensation layer is formed to have one or more vias or trenches such that the first electrode and the second electrode are electrically connected to one another through the one or more vias or trenches.

10. The acoustic wave resonator of claim 9, wherein the temperature compensation layer has a temperature coefficient of frequency that is opposite to that of the piezoelectric layer.

11. The acoustic wave resonator of claim 9, wherein the temperature compensation layer is formed with a material of tellurium oxide, silicon oxide, or a combination of them.

12. An acoustic wave resonator, comprising:

(a) a substrate;

(b) an acoustic reflector formed on the substrate;

(c) a bottom electrode formed on the acoustic reflector;

(d) a piezoelectric layer formed on the bottom electrode; and (e) a composite structure formed on the piezoelectric layer, comprising:

(i) a first electrode formed on the piezoelectric layer;

(ii) a temperature compensation layer formed on the first electrode; and (iii) a second electrode formed on the temperature compensation layer and electrically connected to the first electrodes wherein the temperature compensation layer is formed to have one or more vias or trenches such that the first electrode and the second electrode are electrically connected to one another through the one or more vias or trenches.

13. The acoustic wave resonator of claim 12, wherein the temperature compensation layer has a temperature coefficient of frequency that is opposite to that of the piezoelectric layer.

14. The acoustic wave resonator of claim 12, wherein the temperature compensation layer is formed with a material of tellurium oxide, silicon oxide, or a combination of them.

15. A method of fabricating an acoustic wave resonator comprising a composite structure, comprising the steps of:

(a) forming a first electrode;

(b) forming a temperature compensation layer having a tapered sidewall on the first electrode;

(c) forming one or more vias or trenches in the temperature compensation layer; and (d) forming a second electrode layer on the temperature compensation layer such that the second electrode layer is connected to the first electrode layer through the one or more vias or trenches.

16. The method of claim 15, wherein the step of forming the second electrode layer of the composite structure comprises the steps of:

(a) depositing and patterning a first conductive material on the temperature compensation layer to fill the one or more vias or trenches therein such that the first conductive material filled in the one or more vias or trenches is in contact with the first electrode layer;

(b) planarizing the deposited and patterned first conductive material until the top surface of the temperature compensation layer is exposed; and (c) depositing and patterning a second conductive material on the planarized temperature compensation layer to form the second electrode layer such that the second electrode layer is connected to the first electrode layer, wherein the first and second conductive materials are identical or different.

17. The method of claim 15, wherein the one or more vias or trenches formed in the temperature compensation layer have a cross-sectionally tapered shape.

18. A method of fabricating the acoustic wave resonator of claim 6, comprising the steps of:

(a) forming an acoustic reflector layer on a substrate;

(b) forming a bottom electrode on the acoustic reflector;

(c) forming a first piezoelectric layer formed on the bottom electrode;

(d) forming a composite structure on the first piezoelectric layer, comprising the steps of:

(i) forming a first electrode on the first piezoelectric layer;

(ii) forming a temperature compensation layer having a tapered sidewall on the first electrode;

(iii) forming one or more vias or trenches in the temperature compensation layer; and (iv) forming a second electrode layer on the temperature compensation layer such that the second electrode layer is connected to the first electrode layer through the one or more vias or trenches, wherein the composite structure has a tapered sidewall corresponding to the tapered sidewall of the temperature compensation layer;

(e) forming a second piezoelectric layer on the second electrode of the composite structure; and (f) forming a top electrode on the second piezoelectric layer.

19. The method of claim 18, wherein the step of forming the second electrode layer of the composite structure comprises the steps of:

(a) depositing and patterning a first conductive material on the temperature compensation layer to fill the one or more vias or trenches therein such that the first conductive material filled in the one or more vias or trenches is in contact with the first electrode layer;

(b) planarizing the deposited and patterned first conductive material until the top surface of the temperature compensation layer is exposed; and (c) depositing and patterning a second conductive material on the planarized temperature compensation layer to form the second electrode layer such that the second electrode layer is connected to the first electrode layer, wherein the first and second conductive materials are identical or different.

20. A method of fabricating the acoustic wave resonator of claim 9, comprising the steps of:

(a) forming an acoustic reflector layer on a substrate;

(b) forming a composite structure on the acoustic reflector layer, comprising the steps of:

(i) forming a first electrode on the acoustic reflector layer;

(ii) forming a temperature compensation layer having a tapered sidewall on the first electrode;

(iii) forming one or more vias or trenches in the temperature compensation layer; and (iv) forming a second electrode layer on the temperature compensation layer such that the second electrode layer is connected to the first electrode layer through the one or more vias or trenches, wherein the composite structure has a tapered sidewall corresponding to the tapered sidewall of the temperature compensation layer;

(c) forming a piezoelectric layer on the second electrode of the composite structure; and (d) forming a top electrode on the piezoelectric layer.

21. The method of claim 20, wherein the step of forming the second electrode layer of the composite structure comprises the steps of:

(a) depositing and patterning a first conductive material on the temperature compensation layer to fill the one or more vias or trenches therein such that the first conductive material filled in the one or more vias or trenches is in contact with the first electrode layer;

(b) planarizing the deposited and patterned first conductive material until the top surface of the temperature compensation layer is exposed; and (c) depositing and patterning a second conductive material on the planarized temperature compensation layer to form the second electrode layer such that the second electrode layer is connected to the first electrode layer, wherein the first and second conductive materials are identical or different.

22. A method of fabricating the acoustic wave resonator of claim 12, comprising the steps of:

(a) forming an acoustic reflector layer on a substrate;

(b) forming a bottom electrode layer on the acoustic reflector layer;

(c) forming a piezoelectric layer on the bottom electrode layer;

(d) forming a first electrode layer on the piezoelectric layer;

(e) forming a temperature compensation layer on the first electrode layer;

(f) forming one or more vias or trenches in the temperature compensation layer;

(g) depositing and patterning a conductive material on the temperature compensation layer to fill the one or more vias or trenches therein such that the conductive material filled in the one or more vias or trenches is in contact with the first electrode layer;

(h) planarizing the deposited and patterned conductive material until the top surface of the temperature compensation layer is exposed; and (i) depositing and patterning a second electrode layer on the planarized temperature compensation layer such that the second electrode layer is connected to the first electrode layer at least through the one or more vias or trenches.

23. The method of claim 22, wherein the temperature compensation layer has a temperature coefficient of frequency that is opposite to that of the piezoelectric layer.

24. The method of claim 22, wherein the temperature compensation layer is formed with a material of tellurium oxide, silicon oxide, or a combination of them.

* * * * *